(12) United States Patent
Campardo et al.

(10) Patent No.: US 6,639,833 B2
(45) Date of Patent: Oct. 28, 2003

(54) METHOD AND CIRCUIT FOR DYNAMIC READING OF A MEMORY CELL AT LOW SUPPLY VOLTAGE AND WITH LOW OUTPUT DYNAMICS

(75) Inventors: Giovanni Campardo, Bergamo (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 53 days.

(21) Appl. No.: 10/076,023

(22) Filed: Feb. 13, 2002

(65) Prior Publication Data
US 2002/0149965 A1 Oct. 17, 2002

Related U.S. Application Data

(63) Continuation-in-part of application No. 10/047,918, filed on Jan. 14, 2002.

(30) Foreign Application Priority Data

Feb. 14, 2001 (EP) ............................................ 01830097

(51) Int. Cl.[7] .............................................. G11C 16/00
(52) U.S. Cl. ................................................. 365/185.03
(58) Field of Search ....................... 365/185.03, 185.21, 365/168

(56) References Cited

U.S. PATENT DOCUMENTS 6,034,888 A * 3/2000 Pasotti et al. .......... 365/185.03
6,134,147 A 10/2000 Kaneda ................. 365/185.25
6,459,612 B2 * 10/2002 Satoh et al. ........... 365/185.03

* cited by examiner

*Primary Examiner*—Tan T. Nguyen
(74) *Attorney, Agent, or Firm*—Lisa K. Jorgenson; Robert Iannucci; Seed IP Law Group PLLC (57) ABSTRACT

The method for reading a memory cell includes supplying the cell with a first charge quantity through a capacitive integration element and reintegrating the first charge quantity through a plurality of second charge quantities supplied alternately and in succession to the capacitive integration element. In a first embodiment, the second charge quantities are initially stored in a plurality of capacitive charge-regeneration elements connected alternately and in succession to the capacitive integration element; the second charge quantities are then shared between the capacitive integration element and the capacitive charge-regeneration elements.

26 Claims, 8 Drawing Sheets

(12) United States Patent US 6,639,833 B2

METHOD AND CIRCUIT FOR DYNAMIC READING OF A MEMORY CELL AT LOW SUPPLY VOLTAGE AND WITH LOW OUTPUT DYNAMICS

CROSS-REFERENCE TO RELATED APPLICATION

This application is a continuation-in-part of U.S. patent application Ser. No. 10/047,918, entitled METHOD AND CIRCUIT FOR DYNAMIC READING OF A MEMORY CELL, IN PARTICULAR A MULTI-LEVEL NONVOLATILE MEMORY CELL, filed Jan. 14, 2002, now pending, which application is incorporated herein by reference in its entirety.

BACKGROUND OF THE INVENTION

1. Field of the Invention

The present invention relates to a method and a circuit for dynamic reading of a memory cell at a low supply voltage and with low output dynamics.

2. Description of the Related Art

Figure 1:
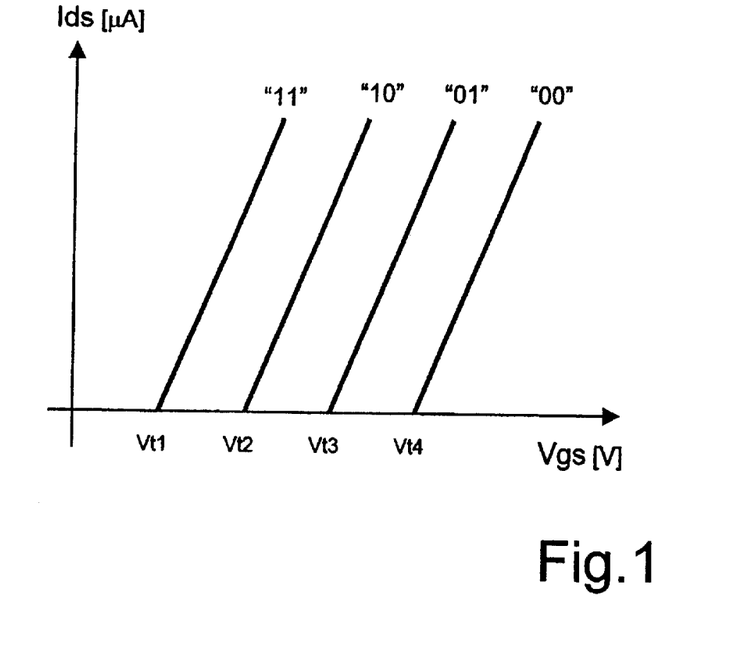
FIG. 1 shows the current-voltage characteristics of a two-bit flash memory cell.

As is known, the need for nonvolatile memories having increasingly larger densities has led to manufacturing multi-level memories wherein the information, stored as charge quantity in a floating-gate region, is encoded by fractioning the entrapped charge. In this way, the characteristic of a multilevel flash cell is described by a number of curves representing the pattern of the drain current Ids as a function of the gate voltage Vgs, each curve being associated to a different logic value. For example FIG. 1 shows the characteristic of a four-level (2-bit) flash cell which stores the bits "11", "10", "01" and "00", corresponding to threshold voltages Vt1, Vt2, Vt3 and Vt4.

Reading of multi-level cells is carried out evaluating the current or the voltage.

Figure 2:
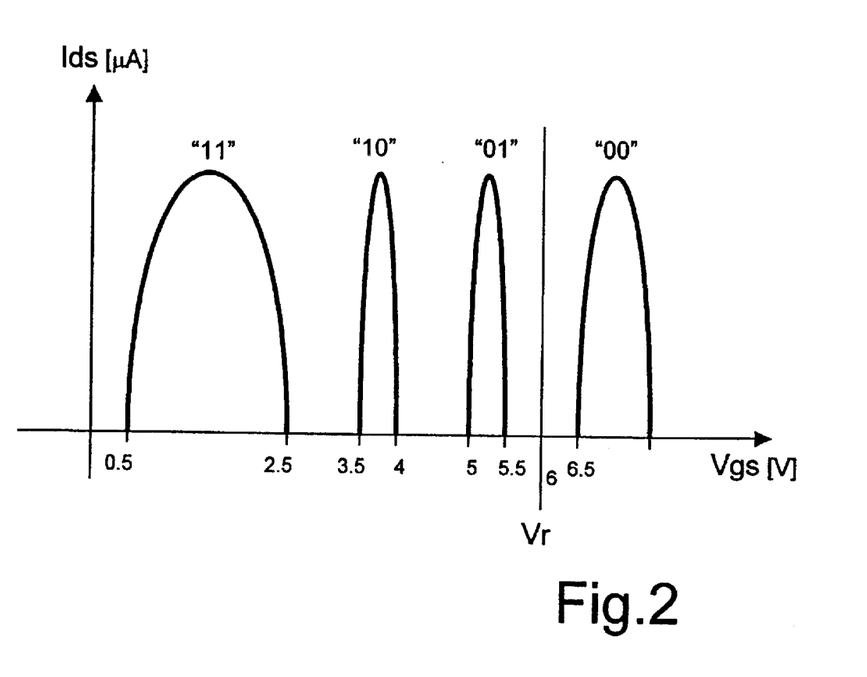
FIG. 2 shows the distribution of the threshold voltages for a two-bit flash memory cell.

Current reading is based on comparing the current flowing in a cell at a preset gate voltage Vgs and the current flowing in a reference cell, the characteristic of which is intermediate between the distributions of the programmed cells, as shown in FIG. 2. The comparison is made after a current-to-voltage conversion, both of the current of the cell and of the reference current.

Current reading has a number of problems, the main ones depend on parasitic resistances, such as source and drain-contact resistance of the cell, resistance of the metal connections, and resistance caused by the pass transistors of the column decoder.

Figure 3:
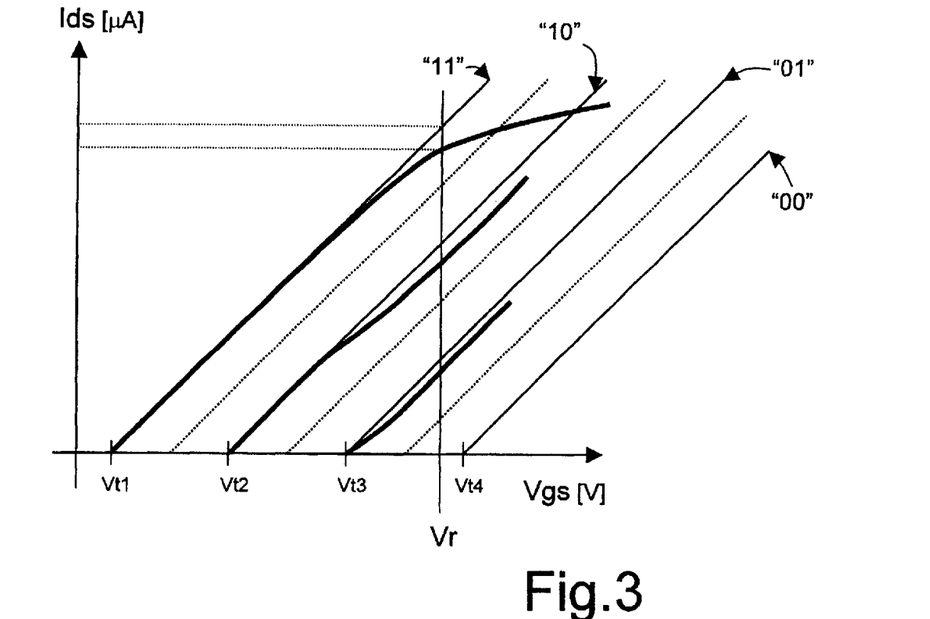
FIG. 3 presents the modification of the ideal characteristics of FIG. 1 in the presence of parasitic effects.

As a whole, the result is a reduction in current dynamics. Consequently, the comparator that compares the voltages after current-to-voltage conversion must have a greater sensitivity. In addition, the actual characteristics differ with respect to the ideal ones, as shown in FIG. 3. Due to such non-idealities, current reading of multilevel memory cells having more than two bits per cell is difficult, because it is required to distinguish extremely near current levels from one another.

Figure 4:
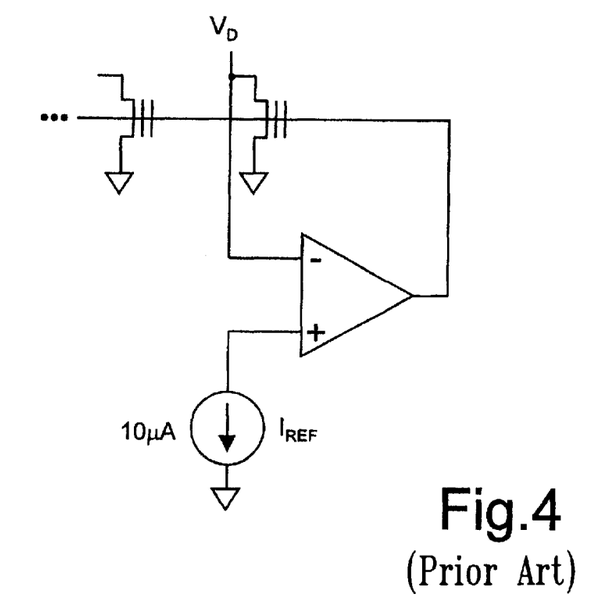
FIG. 4 shows a known voltage-reading circuit.

To overcome the above problems, U.S. Pat. No. 5,034,888, in the name STMicroelectronics, Srl, proposes a voltage reading method using a closed-loop circuit (see FIG. 4). In this circuit, the current of the cell to be read is compared with a reference current, and the gate voltage of the cell is modulated until reaching the equilibrium of the system. Thereby, the gate voltage of the cell reaches a value that can be defined as the threshold value of the cell.

However, also this solution is not free from problems, due to the need for an A/D converter able to read the voltage on the gate terminal of the cell, and to the constraint of not being able to read more than one cell at a time, since the row is in common to more than one cell and cannot assume different voltage values.

The solutions devised for solving the above problems moreover involve other disadvantages (increase in read time, greater area) and in any case call for the capacity to discriminate very small currents. On the other hand, the new technologies, involving a reduction in the cell dimensions, lead in turn to a reduction in the cell current, even though solutions are known for reducing the parasitic effects that determine the losses of linearity.

BRIEF SUMMARY OF THE INVENTION

An embodiment of the present invention improves the reading circuit just described in such a way that it will operate properly even at low supply voltages and will present reduced output dynamics.

An embodiment of the invention is directed to a method for reading a memory cell that includes supplying the cell with a first charge quantity through a capacitive integration element and reintegrating the first charge quantity through a plurality of second charge quantities supplied alternately and in succession to the capacitive integration element. In a first embodiment, the second charge quantities are initially stored in a plurality of capacitive charge-regeneration elements connected alternately and in succession to the capacitive integration element; the second charge quantities are then shared between the capacitive integration element and the capacitive charge-regeneration elements.

BRIEF DESCRIPTION OF THE SEVERAL VIEWS OF THE DRAWING(S)

For a better understanding of the present invention, preferred embodiments thereof are now described, purely to provide non-limiting examples, with reference to the attached drawings, in which.

DETAILED DESCRIPTION OF THE INVENTION

One proposal for a dynamic reading of memory cells is described in European Patent Application N. 01830017.8 of Jan. 15, 2001, in the name of the STMicroelectronics, Srl, from which this application claims priority via the above-discussed parent application filed on Jan. 14, 2002. The proposal is based on time integration of the electric charge supplied to a memory cell to be read through a charging step or a discharging step of a capacitive element, and will be hereinafter discussed with reference to FIGS. 5 and 6.

Figure 5:
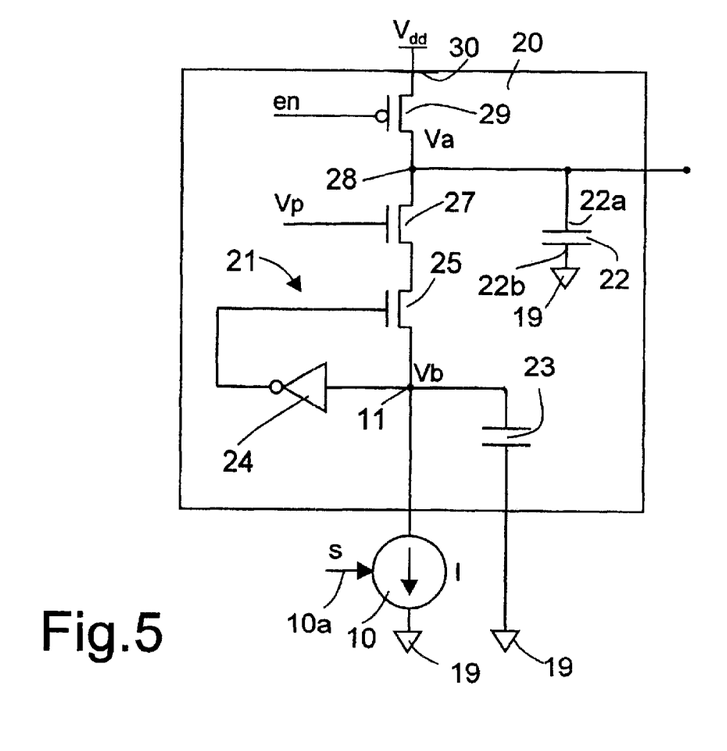
FIG. 5 shows a simplified electrical diagram of a reading circuit proposed in the parent application.

In FIG. 5, a memory cell is represented by a current source 10, which is connected between a ground line or connection—hereinafter referred to as ground line 19—and a charge-transfer node 11. The current source 10 has a control node 10a receiving a first control signal s and absorbs a constant current I directed towards the ground line 19, when enabled by the first control signal s. The charge-transfer node 11 is connected to a reading circuit 20 comprising a decoupling stage 21, a first capacitor 22 having a capacitance Ca, and a second capacitor 23 having a capacitance Cb.

In detail, the decoupling stage 21, formed by a circuit known as "cascode", comprises an inverting element, here an inverter 24, having an input connected to the charge-transfer node 11 and an output connected to the gate terminal of a cascode transistor 25, of NMOS type. The cascode transistor 25 moreover has a source terminal connected to the charge-transfer node 11 and a drain terminal connected to the drain terminal of a pass transistor 27, of NMOS type. The pass transistor 27 has a gate terminal receiving a second control signal Vp and a drain terminal connected to a charge-integration node 28.

The first capacitor 22 has a first terminal 22a connected to the charge-integration node 28 and a second terminal 22b connected to the ground line 19. The charge-integration node 28 is connected to the drain terminal of a charge transistor 29, of PMOS type. The charge transistor 29 has a source terminal connected to a supply line 30 set at the supply voltage Vdd and a gate terminal receiving a charge-enabling signal en.

Finally, the charge-integration node 28 forms the output of the reading circuit 20, and generates a voltage Va proportional, as will be explained hereinafter, to the current I flowing in the current source 10. A voltage Vb is present on the charge-transfer node 11.

Figure 6:
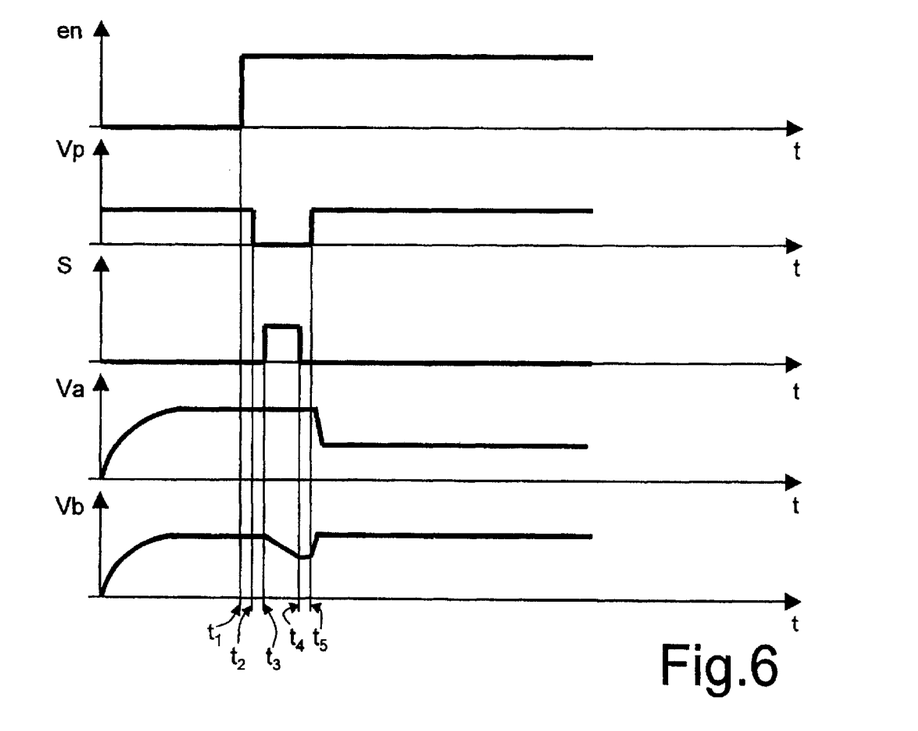
FIG. 6 shows a timing diagram of the circuit of FIG. 5.

According to a first aspect of the invention, operation of the circuit of FIG. 5 is the following (see also FIG. 6).

Initially, the voltages Va and Vb on the charge-integration node 28 and on the charge-transfer node 11 are low. The first control signal s keeps the current source 10 off. In addition, the charge-enabling signal en is low and keeps the charge transistor 29 on. The second control signal Vp is high and keeps the pass transistor 27 on. In this condition, the output of the inverter 24 is high, and the cascode transistor 25 is on and enables charging of the second capacitor 23 up to the threshold voltage of the inverter 24. As soon as the voltage Vb on the charge-transfer node 11 has reached the triggering voltage of the inverter 24, the latter switches and turns off the cascode transistor 25, which interrupts charging of the second capacitor 23. In addition, the first capacitor 22 charges up to the supply voltage (i.e., until Va=Vdd).

In steady-state conditions, at the end of charging, the following relations apply:

$V_{ai} = Vdd$ $Q_{ai} = C_a V_{ai} = C_a Vdd$ $Qb_i = C_b V_{bi}$ where $V_{ai}$ is the value of the voltage $V_a$ at the end of charging step, $Q_{ai}$ is the charge stored in the first capacitor 22, $V_{bi}$ is the value of the voltage $V_b$ at the end of the charging step, and $Q_{bi}$ is the charge stored in the second capacitor 23.

At the instant t1, the charge-enabling signal en switches to the high state (Vdd) and turns off the charge transistor 29 (in this way isolating the first capacitor 22 from the supply line 30). Next (instant t2), the second control signal Vp switches to low and turns off the pass transistor 27 (thereby isolating the charge-transfer node 11 and the charge-integration node 28). Finally (instant t3), the first control signal s switches and turns on the current source 10, which, to a first approximation, goes to a steady-state condition in a negligibly small time, so that the second capacitor 23 will not be affected by current transients.

Consequently, the second capacitor 23 discharges linearly, supplying the constant current I to the current source 10 through the charge-transfer node 11. At the instant t4, the control signal s switches again and turns off the current source 10, thus interrupting the discharging step. In practice, if Δt=t4−t3 is the time interval when the current source 10 is on, ΔVb is the voltage variation on the charge-transfer node 11 for the time interval Δt, and ΔQb is the charge supplied to the current source 10, i.e., the charge lost by the second capacitor 23, we have $$V_{a,t3} = Vdd$$

$$I = C_b \Delta \frac{V_b}{\Delta t}$$

$$I \Delta t = C_b \Delta V_b = \Delta Q_b$$

$$\Delta V_b = \frac{I \Delta t}{C_b} = \frac{\Delta Q_b}{C_b}$$

For example, with $C_a$=0.5 pF and $C_b$=5 pF, the time interval Δt when discharging of the second capacitor 23 takes place is about 60 nsec.

Next (instant t5), the second control signal Vp switches again to high, turning on the pass transistor 27 and connecting together, through the decoupling stage 21, the charge-integration node 28 and the charge-transfer node 11. Consequently, the first capacitor 22 discharges rapidly to the second capacitor 23, re-integrating the charge lost by the latter, according to a charge-sharing process. In practice, the first capacitor 22 operates as a charge reservoir. However, the charge-integration node 28 and the charge-transfer node 11 do not assume the same potential. In fact, the decoupling stage 21 allows the charge-transfer node 11 to reach only the value of the triggering voltage of the inverter 24, after which the inverter 24 turns on the cascode transistor 25, thus once again isolating the charge-integration node 28 from the charge-transfer node 11. The charge-integration node 28, instead, goes to a voltage value $V_{af}$ given by the capacitive sharing between the second capacitor 23 and the first capacitor 22 (charge-sharing step).

At the end, in steady-state conditions, the final voltage on the first capacitor 22 is equal to $V_{af}$, the final charge of the first capacitor 22 is equal to $O_{af}$, and the charge transferred from the first capacitor 22 to the second capacitor 23 is $\Delta Q_a$, equal to the charge ΔQb lost by the first capacitor (which has returned to the initial conditions). Consequently, we have $$V_{bf} = V_{bi-}^*$$

$$V_{a,f} = \frac{Q_{af}}{C_a} = \frac{Q_{ai} - \Delta Q_a}{C_a} = \frac{Q_{ai} - \Delta Q_b}{C_a}$$

$$= \frac{C_a V_{ai} - I\Delta t}{C_a} = \frac{C_a V_{cc} - I\Delta t}{C_a}$$

and hence $$V_{a,f} = V_{cc} - \frac{I\Delta t}{C_a} \quad (1)$$

In practice, there exists a linear relation between the final voltage Va on the charge-integration node 28 and the current absorbed by the current source 10. Consequently, integrating the current absorbed by the current source 10 in a preset time interval (integration time Δt), the voltage Va on the charge-integration node 28 is proportional to the current I. Consequently, by appropriately sizing the integration time Δt and the capacitance Ca, the value of the current I, even if very small, can be converted into a voltage value (voltage Va) having an amplitude that may be read with present-day current circuits.

In addition, from Equation (1) it is possible to calculate the variation ΔVa of the voltage Va on the charge-integration node 28 generated by variations ΔI of the current of the current source 10. In fact, from Equation (1) it is $$\frac{\Delta V_a}{\Delta I} = -\frac{\Delta t}{C_a} \quad (2)$$

Relation (2) makes it possible to distinguish very small current variations from one another by measuring the voltage difference ΔVa that may be obtained on the charge-integration node 28.

For example, setting Δt=50 ns, if a variation ΔVa of 100 mV is desired for a current variation ΔI=1 μA, we obtain $$C_a = \frac{\Delta I}{\Delta V_{af}} \Delta t = 0.5 \text{ pF}$$

If it is desired a reduction of the voltage Vb on the charge-transfer node 11 of 0.5 V in 50 ns for a maximum current of 50 μA (which is assumed as being the maximum of the dynamics for the memory cell represented schematically by the current source 10), we have $$C_a = \frac{I\Delta t}{\Delta V_b} = 5 \text{ pF}$$

With this sizing we then obtain that, for each μA of variation in the current I of the current source 10, the voltage Va on the charge-integration node 28 varies by 100 mV, which can be detected without any problems.

In the above-discussed parent application, it is moreover demonstrated that the source 10 is equivalent to a nonvolatile memory cell which may be connected to and disconnected from the charge-transfer node 11 through the column decodier (which receives the control signal s) and a further cascode circuit.

The reading circuit described above thus makes it possible to discriminate in short times programming states that are very close to one another, in practice enabling an increase in the number of bits that can be stored in a cell (for example, four bits, corresponding to 16 programming levels), but has some limitations. When the number of stored bits is high, in fact, in order to set sufficiently far apart the values of the voltage Va corresponding to the various programming states, it is necessary to charge the first capacitor 22 to a high initial voltage, i.e., higher than the supply voltages that are normally available. To obtain such voltages it is necessary to use dedicated boosting devices, such as charge pumps, which, however, have a low level of efficiency, have a considerable bulk, and hence entail disadvantages both in terms of overall dimensions and consumption. In addition, also the output dynamics is high and wider than the supply voltage. It is therefore necessary to provide further charge pumps for supplying the stages downstream of the reading circuit, or else level-translator circuits that modify the output dynamics of the reading circuit itself.

Figure 7:
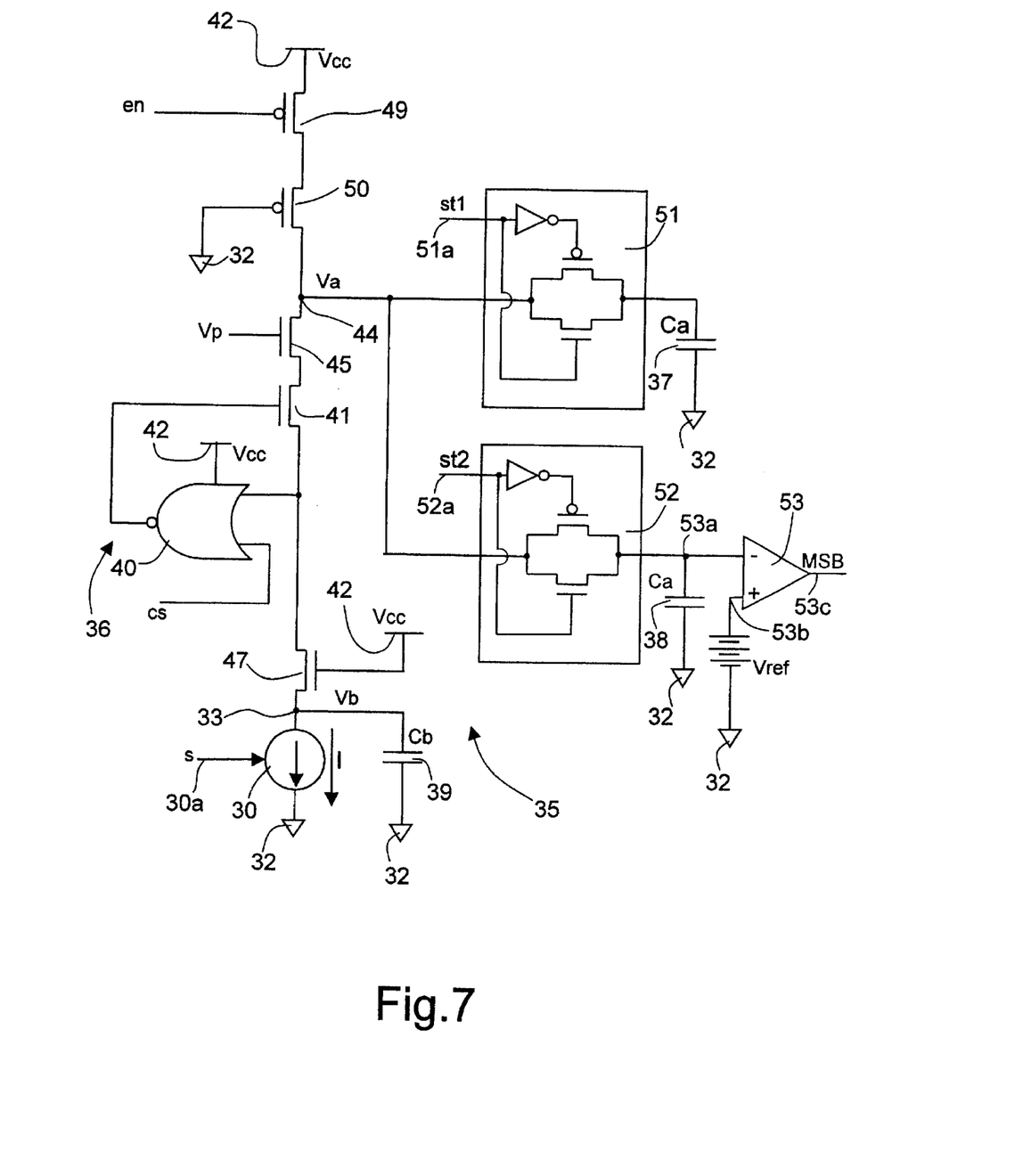
FIG. 7 shows a simplified electrical diagram of a first embodiment of the reading circuit according to the invention.

With reference to FIG. 7, a controlled current source 30, having a control terminal 30a that receives a first control signal s, is connected between a ground line or ground connection—hereinafter referred to as ground line 32—and a charge-transfer node 33, and absorbs a constant current I directed to the ground line 32 when enabled by the first control signal s. The charge-transfer node 33 is connected to a reading circuit 35 comprising a decoupling stage 36, a first charge-regeneration capacitor 37 and a second charge-regeneration capacitor 38 which have equal capacitances Ca, and an integration capacitor 39 having capacitance Cb.

In detail, the decoupling stage 36, which is formed by a circuit known as "cascode" circuit, comprises an inverting element, here a NOR gate 40, having a first input connected to a source terminal of a cascode transistor 41, of the NMOS type, a second input receiving a second control signal cs, and an output connected to the gate terminal of the cascode transistor 41. In addition, the NOR gate 40 has a supply terminal connected to a supply line 42, which supplies a non-boosted supply voltage Vcc of, for example, 3 V; and the cascode transistor 41 has its drain terminal connected to a charge-integration node 44 via the pass transistor 45, which receives a third control signal Vp on its gate terminal.

A load transistor 47, of the NMOS type, is connected between the charge-transfer node 33 and the source terminal of the cascode transistor 41 and has its gate terminal connected to the supply line 42 set at the supply voltage Vcc, and is consequently always on. The load transistor 47 simulates the load of the column decoder.

A charging transistor 49, of the PMOS type, receives, on its gate terminal, a charge-enable signal en and has its source terminal connected to the supply line 42 and its drain terminal connected to the charge-integration node 44 via the auxiliary transistor 50, which is also of the PMOS type. The auxiliary transistor 50, which has its gate terminal connected to the ground line 32 and is thus always on, minimizes the effects of coupling between the charge-enable signal en and the charge-integration node 44 (to which the charge-regeneration capacitors 37, 38 are connected, as illustrated hereinafter) when the charging transistor 49 is turned off.

The first and second charge-regeneration capacitors 37, 38 are connected between the ground line 32 and the charge-integration node 44 via respective switches 51, 52. The switches 51, 52, preferably formed by CMOS transfer gates, receive, on respective control terminals 51a, 52a, a first timing signal st1 and a second timing signal st2, respectively. A comparator 53 has an inverting input 53a connected to the terminal of the second charge-regeneration capacitor 38 which is not connected to the ground line 32; a non-inverting input 53b connected to a reference-voltage source which supplies a reference voltage Vref slightly lower than the supply voltage Vcc; and an output 53c supplying a logic signal MSB that indicates the most significant bit of a word stored in the memory cell being read.

The integration capacitor 39 is instead connected between the charge-transfer node 33 and the ground line 32.

A voltage Va is present on the charge-integration node 44; a voltage Vb is present on the charge-transfer node 33.

Figure 8:
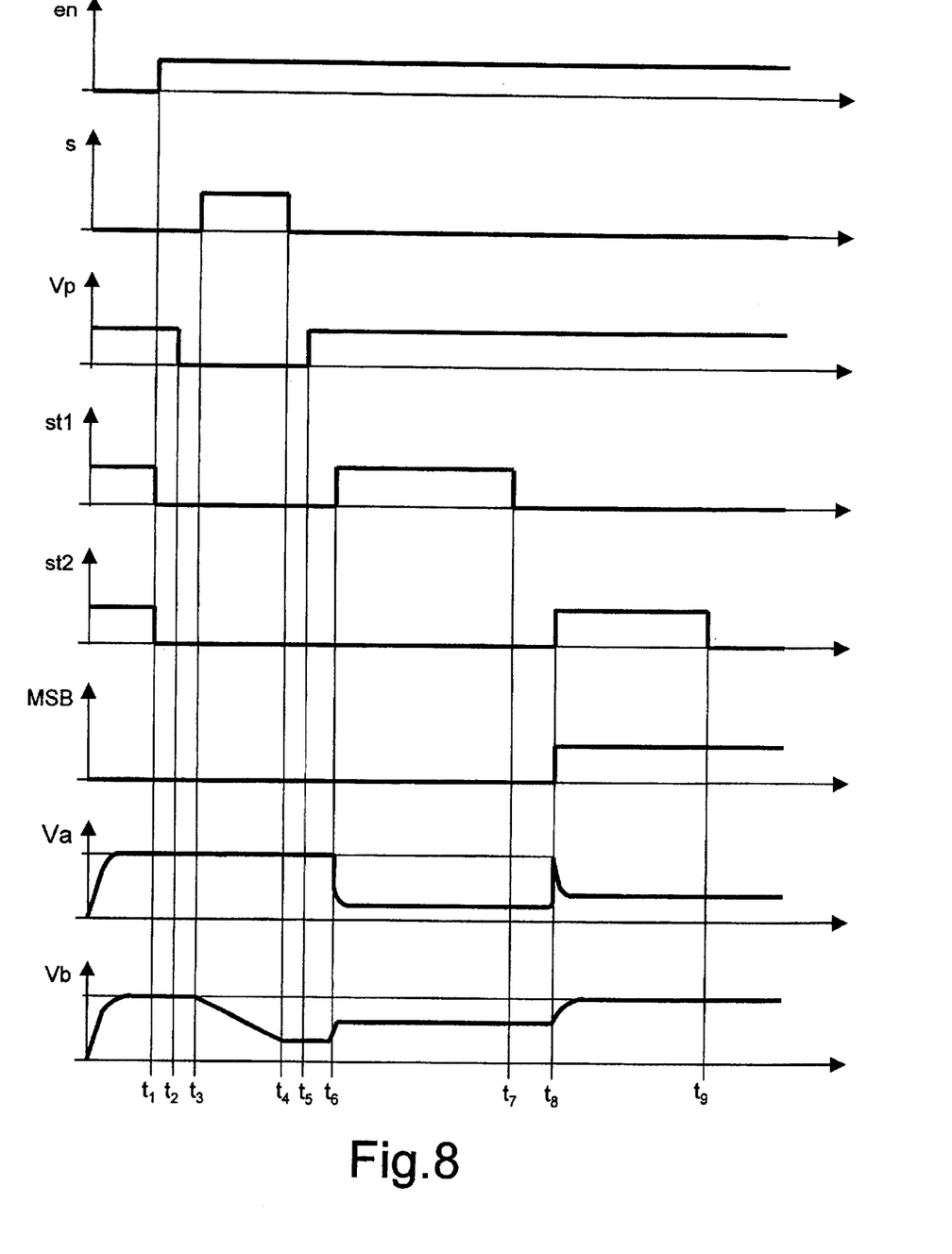
FIG. 8 shows a timing diagram of the circuit of FIG. 7.

Operation of the reading circuit 35 is described hereinbelow with reference also to FIG. 8.

Initially, the voltages Va and Vb respectively on the charge-integration node 44 and on the charge-transfer node 33 are low. The first control signal s keeps the current source 30 off. In addition, the charge-enable signal en is low and keeps the charge transistor 49 on. The second control signal cs is low and enables the switchings of the NOR gate 40. The third control signal Vp is high (equal to Vcc) and keeps the pass transistor 45 on. The timing signals st1, st2 are both high and close the switches 51, 52. In this condition, the output of the NOR gate 40 is high, and the cascode transistor 41 is on and enables charging of the integration capacitor 39 up to the triggering voltage of the NOR gate 40. As soon as the voltage Vb on the charge-transfer node 33 reaches the triggering voltage of the NOR gate 40, the latter switches and turns off the cascode transistor 41, which interrupts charging of the integration capacitor 39. In addition, the charge-regeneration capacitors 37, 38 are charged up to the supply voltage (i.e., until Va=Vcc). In practice, on each of the two charge-regeneration capacitors 37, 38 an equal charge Qa is initially stored, which is given by the equation Qa=Ca Vcc.

Altogether, therefore, the charge stored is 2Qa.

At the instant t1, the charge-enable signal en switches to the high state (to Vcc) and turns off the charging transistor 49, while the timing signals st1, st2 go to the low state and turn off both the switches 51, 52. In this way, the integration node 44 is isolated both from the supply line 42 and from the charge-regeneration capacitors 37, 38. Next (instant t2), the third control signal Vp switches to the low state and turns off the pass transistor 45 (in this way isolating the charge-transfer node 33 from the charge-integration node 44).

Subsequently (instant t3), the first control signal s switches and turns on the current source 10, which, to a first approximation, reaches a steady-state condition in a negligible time in such a way that the integration capacitor 39 does not "see" current transients. Consequently, the integration capacitor 39 discharges linearly, supplying the constant current I to the current source 30 through the charge-transfer node 33. At the instant t4, the control signal s switches again and turns off the current source 30, interrupting the discharging step. In practice, in the time interval $\Delta t=t4-t3$ in which the current source 30 is on, the integration capacitor 39 loses a charge $\Delta Qb$ proportional to the current I according to the law $$\Delta Qb = I \Delta t$$

Subsequently (instant t5), the third control signal Vp switches to the high state again, turning on the pass transistor 45, and hence the charge-integration node 44 and the charge-transfer node 33 are connected together again through the decoupling stage 36. In fact, the voltage Vb on the charge-transfer node 33 is now lower than the triggering threshold of the NOR gate 40, the output of which is high and keeps the cascode transistor 41 on.

At the instant t6, the first timing signal st1 is set at the high state (i.e., at Vcc), thus closing the switch 51 that connects the first charge-regeneration capacitor 37 to the integration node 44. Consequently, the first charge-regeneration capacitor 37 discharges rapidly towards the integration capacitor 39, reintegrating the charge lost by the latter, according to a charge-sharing process.

Suppose initially that the charge present in the first charge-regeneration capacitor 37 is not sufficient for complete replacement of the charge $\Delta Qb$ lost by the integration capacitor 39. In this case, the voltages Va and Vb respectively on the integration node 44 and on the charge-transfer node 33 are both below the triggering threshold of the NOR gate 40, and the cascode transistor 41 remains on.

At the instant t7, the first timing signal st1 is set at the low state again, thus opening the corresponding switch 51 and disconnecting the first charge-regeneration capacitor 37 from the integration node 44. At the instant t8, the second timing signal st2 switches to the high state and closes the switch 52 which connects the second charge-regeneration capacitor 38 to the integration node 44. In particular, the instants t7 and t8 are separated by a time interval such as to enable disappearance of the turning-off transient of the switch 51, and consequently, in this step, the charge-regeneration capacitors 37, 38 are never connected directly together.

Starting from the instant t8, also the second charge-regeneration capacitor 38 discharges towards the integration capacitor 39, transmitting part of the stored charge Qa. Discharging of the second charge-regeneration capacitor 38 is interrupted when the charge $\Delta Qb$ lost by the integration capacitor 39 is completely reintegrated. When this occurs, in fact, the voltage Vb on the charge-transfer node 33 again reaches the triggering voltage of the NOR gate 40, which switches, thus turning off the cascode transistor 41 and isolating the charge-transfer node 33 from the integration node 44 (and hence from the second charge-regeneration capacitor 38). In particular, in this step, the charge-integration node 44 goes to a voltage value determined by the residual charge present on the second charge-regeneration capacitor 38 and comprised between the supply voltage Vcc and, substantially, the triggering voltage of the NOR gate 40. In addition, the decrease in the voltage on the second charge-regeneration capacitor 38 causes switching of the comparator 53, and hence the logic signal MSB goes to a high value (equal to Vcc). The high logic value of the logic signal MSB and the voltage on the second charge-regeneration capacitor 38 make it possible to determine, together, the charge $\Delta Qb$ lost by the integration capacitor 39, and hence the current I flowing in the current source 30, analogously to what was described above for the circuit of FIG. 5.

If, instead, the charge Qa present on the charge-regeneration capacitor 37 is sufficient for restoring the charge $\Delta Qb$ lost by the integration capacitor 39, the voltage Vb on the charge-transfer node 33 reaches the triggering voltage of the NOR gate between the instants t6 and t7, when the first charge-regeneration capacitor 37 is connected to the integration node 44. During this time interval, then, the cascode transistor 41 is turned off, and the charge-transfer node 33 is isolated from the integration node 44. Consequently, when the second charge-regeneration capacitor 38 is connected to the integration node 44 (instant t8) no further charge transfers are possible. In addition, the logic signal MSB remains at the low value. In this case, the low logic value of the logic signal MSB and the voltage existing on the first charge-regeneration capacitor 37 make it possible to find the current flowing in the current source 30.

In both cases, the dynamics of the voltage Va on the integration node 44 goes from the triggering voltage of the NOR gate 40 (approximately 1 V) to the supply voltage Vcc.

In practice, reintegration of the charge $\Delta Qb$ lost by the integration capacitor 39 occurs by dividing the whole usable charge 2Qa into a number of packets (Qa) which are rendered available in succession. Advantageously, this enables the whole usable charge 2Qa to be stored in two distinct charge-regeneration capacitors 37, 38 charged at the supply voltage Vcc, without having to use boosting devices. In addition, the output dynamics of the reading circuit do not exceed the supply voltage Vcc, and hence also the analog-to-digital conversion stage downstream of the reading circuit itself can be supplied just with the supply voltage Vcc. The levels of the output voltage, which are not reduced in number, are in any case set at distances apart and can be easily recognized; it is therefore possible to store a high number of bits in each cell.

According to a different embodiment of the invention, the various charge packets may be supplied, instead of by two charge-regeneration capacitors 37, 38, by a single charge-regeneration capacitor, which, in successive steps, is repeatedly charged at the supply voltage Vcc and connected to the integration capacitor 39. In detail, a reading circuit 35', shown in FIG. 9, differs from the circuit 35 of FIG. 7 in that it comprises a single charge-regeneration capacitor (for example, the second charge-regeneration capacitor 38), which has a first terminal connected to the ground line 32 and a second terminal directly connected to the integration node 44. In addition, the non-inverting input 53a of the comparator 53 is connected to a reference-voltage source 54' supplying a reference voltage Vref', for example equal to the triggering voltage of the NOR gate 40. The reading circuit 35' moreover comprises a logic circuit 56 having an input 56a connected to the output 53c of the comparator 53 and receiving the logic signal MSB, and an output supplying a confirmation signal en2.

Figure 9:
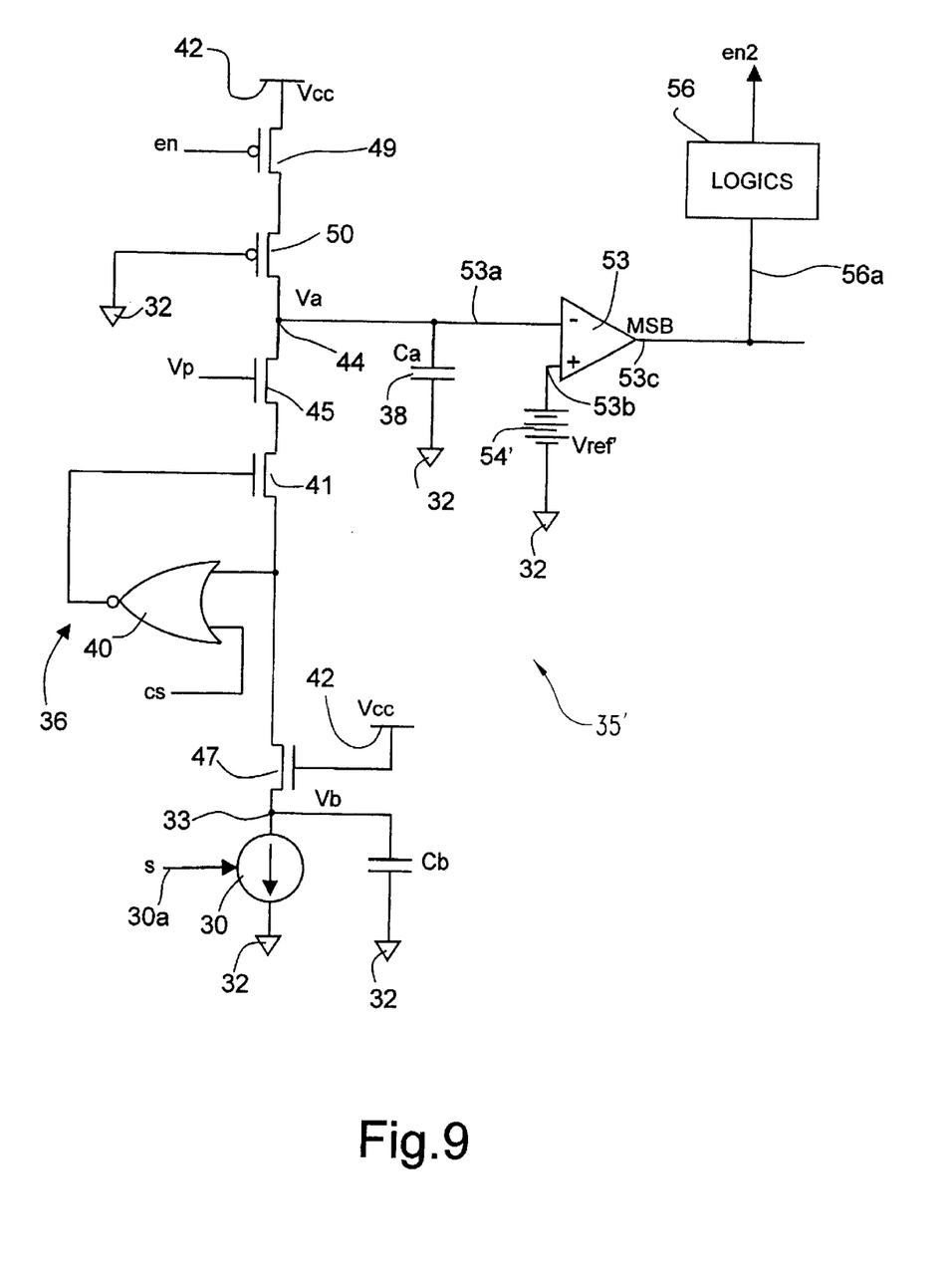
FIG. 9 shows a simplified electrical diagram of a second embodiment of the reading circuit according to the invention.

The logic circuit 56, which may be made in an obvious way by a person skilled in the art and is not therefore shown in detail, detects the value of the logic signal MSB after a first charge-sharing step (as will be explained in what follows) and sets the confirmation signal en2 at a confirmation value (for example low, 0 V) if the logic signal MSB indicates that the second charge-regeneration capacitor 38 has released the entire available charge; otherwise it is set at an inhibition value (for example high, Vcc). When the confirmation signal en2 assumes the inhibition value, switchings of the charge-enable signal en are inhibited, and the reading process is automatically terminated.

Figure 10:
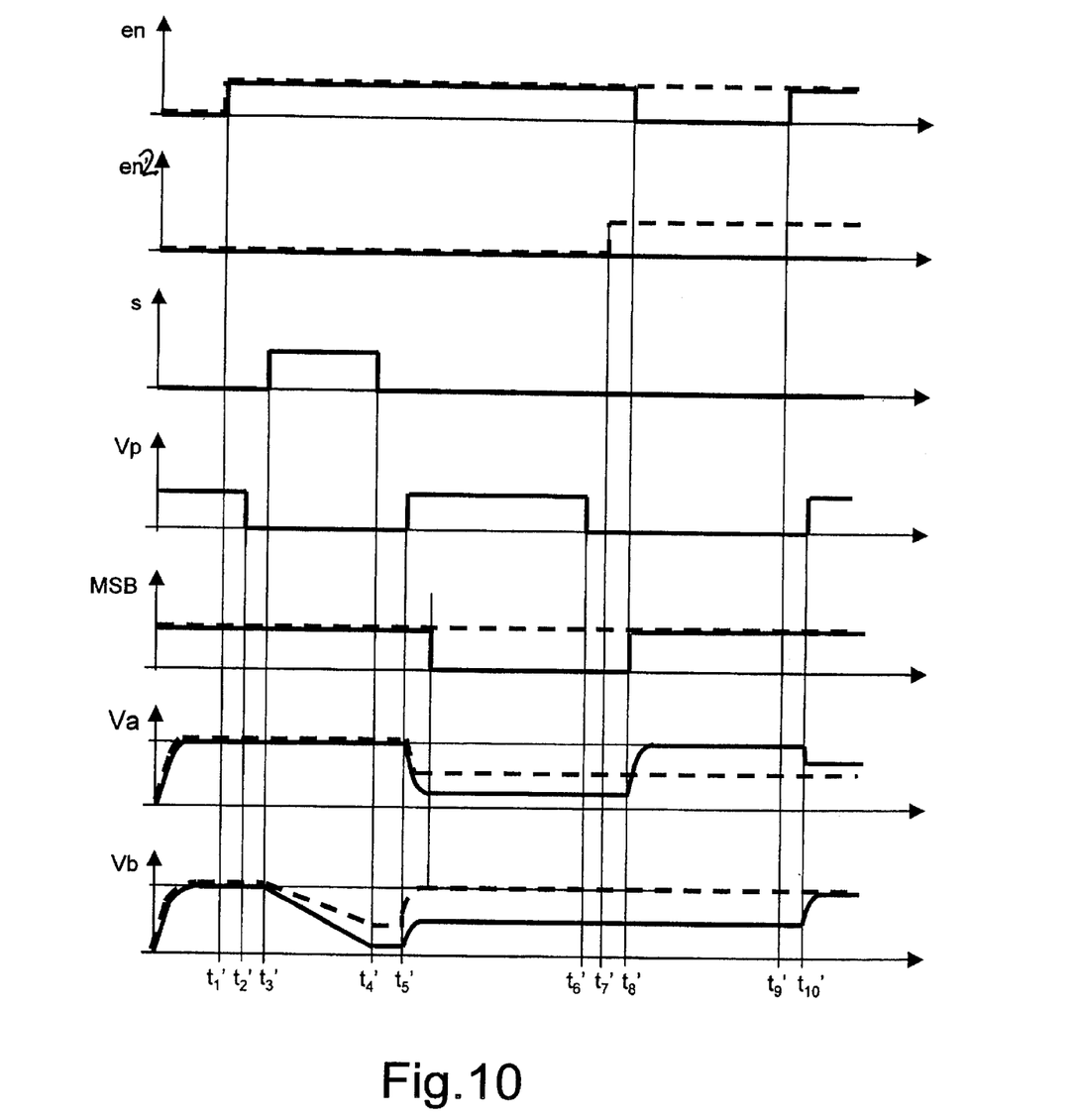
FIG. 10 shows a timing diagram of the circuit of FIG. 9.

With reference to FIG. 10, initially the first control signal s is low as was described previously, the third control signal Vp is high and the pass transistor 45 conducts, the charge-enable signal en is set at the low level, and the charging transistor 49 is turned on (the confirmation signal en2 is initially at the confirmation value). In this step, the voltage Va on the integration node 44 reaches the value of the supply voltage Vcc, the second charge-regeneration capacitor 38 stores a charge Qa, and the voltage Vb on the charge-transfer node 33 reaches the triggering voltage of the NOR gate 40, the output of which switches and turns off the cascode transistor 41. At the instant t1', the charge enable signal en switches to the high state (to Vcc) and turns off the charging transistor 49.

Subsequently (instant t2'), the pass transistor 45 is turned off by setting the third control signal Vp at the low state. Then, in a time interval comprised between the instants t3' and t4', the first control signal s is set at the high level, so as to turn on the current source 30 and discharge the integration capacitor 39.

The third control signal Vp is then brought back to the high value (instant t5') to turn on the cascode transistor 45 again and to connect together the integration node 44 and the charge-transfer node 33. At this point, the step of sharing the charge Qa on the second charge-regeneration capacitor 38 starts to reintegrate the charge ΔQb lost by the integration capacitor 39. This step terminates at the instant t6', when the third control signal Vp switches to low and the charge-transfer node 33 and the integration node 44 are disconnected.

Subsequently (instant t7'), the logic circuit 56 reads the value of the logic signal MSB.

If the charge Qa on the second charge-regeneration capacitor 38 has been sufficient to reintegrate the charge ΔQb lost by the integration capacitor 39 (dashed line in FIG. 10), and hence the logic signal MSB has not switched, the confirmation signal en2 switches to the inhibition value, thus preventing further switchings of the charge-enable signal en and terminating the reading process.

Otherwise (solid line in FIG. 10), the confirmation signal en2 remains at the confirmation value, and a command is issued for a new cycle of charging of the second charge-regeneration capacitor 38 and of charge sharing. In detail, in the time interval between an instant t8' and an instant t9', the charge-enable signal en switches to low, so as to turn on the charging transistor 49 and to connect the second charge-regeneration capacitor 38 to the supply line 42. Finally (instant t10'), the third control signal Vp switches to high, thus turning on the pass transistor 45 and connecting the charge-transfer mode 33 and the integration node 44 together again. In this way, the charge Qa which is present again on the second charge-regeneration capacitor 38 is made available for reintegration of the charge ΔQb lost by the integration capacitor 39. The value of the voltage Va on the integration node 44 and of the logic signal MSB thus enable determination of the charge ΔQb lost by the integration capacitor 39, and hence of the current I absorbed by the source 30.

According to the latter embodiment, in practice, the charge packets Qa are supplied in successive charging cycles and are made available if the charge ΔQb lost by the integration capacitor 39 has not been completely restored in a previous charge-sharing step.

The embodiment described clearly affords the advantage of a smaller bulk, since it comprises a single charge-regeneration capacitor, and thus this embodiment is particularly suitable for being used when the requirements regarding overall dimensions are particularly stringent.

Figure 11:
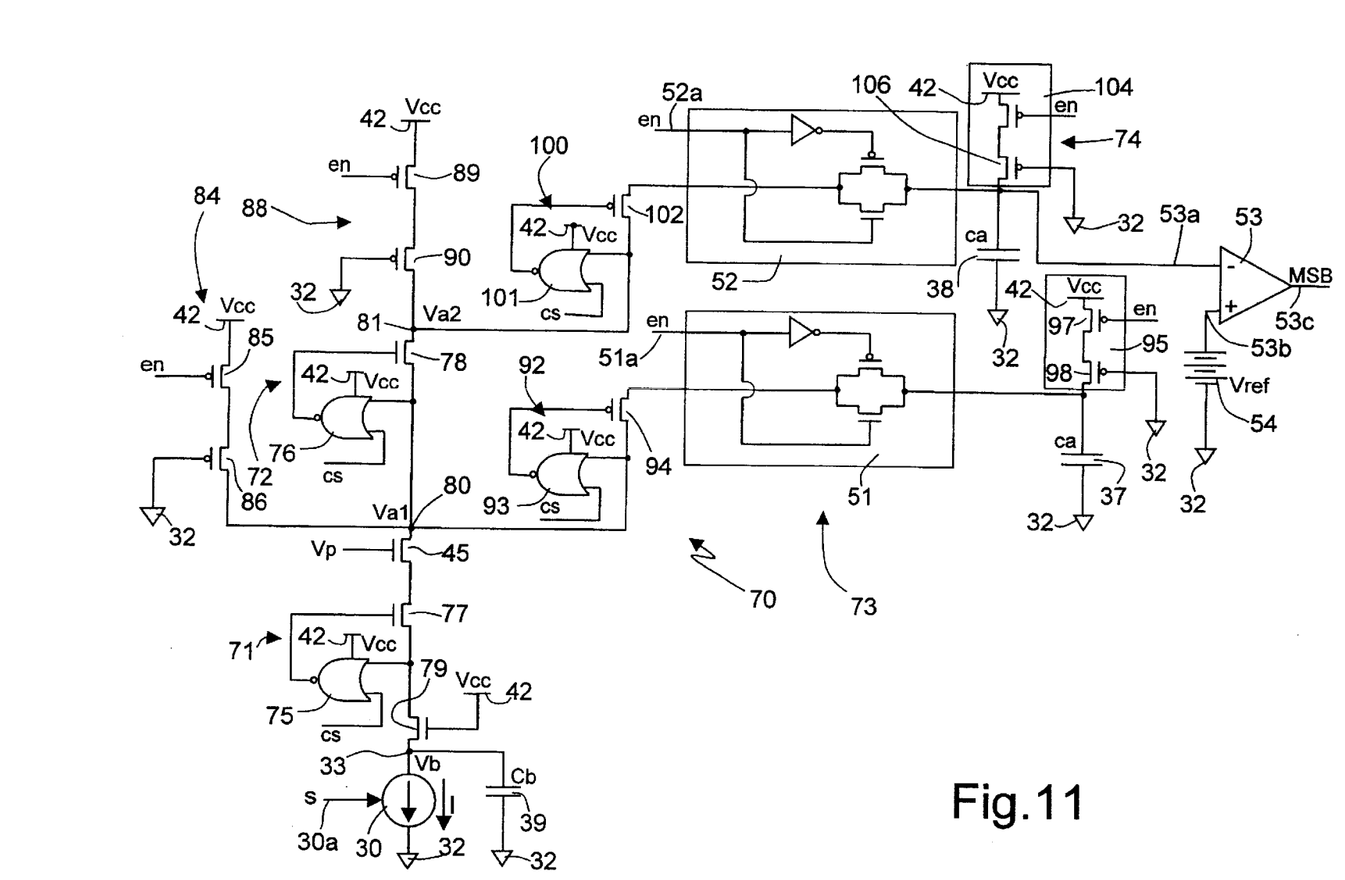
FIG. 11 shows the plots of electrical quantities obtained in a simulation made for the circuit of FIG. 9.

A third embodiment of the invention will be illustrated hereinafter with reference to FIG. 11, in which parts present in FIG. 7 are designated by the same reference numbers. In the present case, the current source 30 is connected to the charge-transfer node 33, which forms part of a reading circuit 70 comprising a first decoupling stage 71 and a second decoupling stage 72, a first charge-regeneration branch 73 and a second charge-regeneration branch 74, as well as the integration capacitor 39.

The decoupling stages 71, 72 are similar to the decoupling stage 36 of FIG. 7 and comprise respective NOR gates 75, 76, which are enabled by the second control signal cs, and respective cascode transistors 77, 78. In detail, the cascode transistor 77 of the first decoupling stage 71 has its source terminal connected to the charge-transfer node 33 through a column transistor 79 which simulates the presence of a column decoder, and its drain terminal connected to a first integration node 80—on which a voltage Va1 is present—through the pass transistor 45 which receives the third control signal Vp on its own gate terminal. The cascode transistor 78 of the second decoupling stage 72 has its source terminal connected to the first integration node 80 and its drain terminal connected to a second integration node 81, on which a voltage Va2 is present. In practice, the reading circuit 70 has a double-cascode structure.

A first charging branch 84 comprises a charging transistor 85, of PMOS type, receiving the charge-enable signal en on its gate terminal. The charging transistor 85 has its source terminal connected to the supply line 42 and its drain terminal connected to the first integration node 80 through an auxiliary transistor 86, which is also of PMOS type and which has its gate terminal connected to the ground line 32, is always on, and has the function of decoupling the charge-enable signal en from the first integration node 80. A second charging branch 88, which is identical to the first charging branch 84, comprises a charging transistor 89 and an auxiliary transistor 90, and is connected to the second integration node 81.

The first charge-regeneration branch 73 comprises the first charge-regeneration capacitor 37, the switch 51, the control terminal 51a of which receives the charge-enable signal en, and a third decoupling stage 92 set between the switch 51 and the first integration node 80. In detail, the third decoupling stage 92 comprises a NOR gate 93 having a first input connected to the drain terminal of a PMOS cascode transistor 94, a second input receiving the second control signal cs, and an output connected to the gate terminal of the cascode transistor 94. In addition, the drain terminal and source terminal of the cascode transistor 94 of the third decoupling stage 92 are respectively connected to the first integration node 80 and, through the switch 51, to the first charge-regeneration capacitor 37. In practice, the third decoupling stage 92 behaves in a complementary way with respect to the decoupling stages 75, 76. In fact, the cascode transistor 94 conducts when the voltage Va1 on the first integration node 80 is higher than the triggering voltage of the NOR gate 93; otherwise, it is off.

A third charging branch 95, which is identical to the charging branches 84, 88, comprises a charging transistor 97 and an auxiliary transistor 98, and is connected to the first charge-regeneration capacitor 37.

The second charge-regeneration branch 74 has a structure similar to that of the first charge-regeneration branch 73 and, in particular, comprises the second charge-regeneration capacitor 38, the switch 52, the control terminal 52a of which receives the charge-enable signal en, and a fourth decoupling stage 100 set between the switch 52 and the second integration node 81. The fourth decoupling stage 100 comprises a NOR gate 101 and a cascode transistor 102 which are connected together in the same way as the NOR gate 93 and the cascode transistor 94 of the third decoupling stage 92. In addition, the cascode transistor 102 of the fourth decoupling stage 100 has its drain terminal connected to the second integration node 81 and its source terminal connected to the second charge-regeneration capacitor 38 through the switch 52.

A fourth charging branch 104, which is identical to the previous charging branches and comprises a charging transistor 105 and an auxiliary transistor 106, is connected to the second charge-regeneration capacitor 38.

The reading circuit 70 also comprises the comparator 53, which has an inverting input 53a connected to the terminal of the second charge-regeneration capacitor 38 not connected to the ground line 32; a non-inverting input 53b connected to a reference-voltage generator 54 that supplies the reference voltage Vref; an output 53c which supplies the logic signal MSB indicating the most significant bit of a word stored in the memory cell being read.

The first integration node 80 and the second integration node 81 respectively form a first output and a second output of the reading circuit 70. In addition, the logic signal MSB is used for controlling a selector (known and not illustrated) which selects between the outputs of the reading circuit 70 the one that is to be supplied to the analog-to-digital conversion stages (not shown) downstream of the reading circuit 70 itself.

Finally, all the decoupling stages 71, 72, 92, 100 are sized in such a way as to have the same triggering voltage.

The charging and discharging steps of the integration capacitor 39 basically take place as already described previously. In particular, the charge-enable signal en is initially high (at Vcc), and consequently the charging transistors 85, 89, 97, 105 are off, while the switches 51, 52 are closed; the second control signal cs is low and enables switching of the NOR gates 75, 76, 93, 101; the third control signal Vp is high and keeps the pass transistor 45 on; in addition, the voltage Vb on the charge-transfer node 33, the voltage Va1 on the first integration node 80, and the voltage Va2 on the second integration node 81 are low.

Next, the charge-enable signal en switches to the low value (0 V). In this condition, the charging transistors 85, 89, 97, 105 are turned on, and the switches 51, 52 are closed. Consequently, the first and second integration nodes 80, 81 are charged to the supply voltage Vcc respectively through the first charging branch 84 and the second charging branch 88; the first charge-regeneration capacitor 37 and the second charge-regeneration capacitor 38 are also charged to the supply voltage Vcc, and each of them stores a charge Qa, respectively through the third charging branch 95 and the fourth charging branch 104; and the charge-transfer node 33 is charged up to the triggering voltage of the first decoupling stage 71.

The charge-enable signal en is then brought back the low value, so as to turn off again the charging transistors 85, 89, 97, 105 and isolate the integration nodes 80, 81 and the charge-regeneration capacitors 37, 38 from the supply line 42. In addition, the switches 51, 52 are closed and conduct.

Next, the third control signal Vp is set at the low value, turns off the pass transistor 45, and isolates the charge-transfer node 33 from the first integration node 80. Then, through the first control signal s, the current source 30 is turned on for the time interval $\Delta t$, and the integration capacitor 39 discharges, losing a charge $\Delta Qb$ equal to $I\Delta t$. The third control signal Vp is then brought back to the high value.

In this step, the first, third, and fourth decoupling stages 71, 92, 100 are on (i.e., the respective cascode transistors 77, 94, 102 conduct), since the voltage Vb on the charge-transfer node 33 is lower than the triggering voltage of these stages. Consequently, the first charge-regeneration capacitor 37 is connected to the integration capacitor 39 and can release its own charge Qa that it has stored. The second decoupling stage 72, instead, remains off (i.e., the cascode transistor 78 is inhibited) until the voltage Va1 on the first integration node 80 drops below the triggering voltage, i.e., until the first charge-regeneration capacitor 37 has released the entire charge available. In practice, as long as this does not happen, the second charge-regeneration capacitor 38 cannot discharge.

If the charge Qa stored in the first charge-regeneration capacitor 37 is sufficient for reintegration of the charge $\Delta Qb$ lost by the integration capacitor 39, the voltage Vb on the charge-transfer node 33 reaches the triggering voltage of the first decoupling stage 71, which turns off and automatically interrupts the charge-sharing process.

Otherwise, the voltage Va1 on the first integration node 80 drops below the triggering voltage, thus simultaneously turning-off the third decoupling stage 92 and turning-on of the second decoupling stage 72. In this way, the first charge-regeneration capacitor 37 is isolated, while the second charge-regeneration capacitor 38 is connected to the integration capacitor 39. Consequently, also the charge Qa stored in the second charge-regeneration capacitor 38 is made available for reintegration of the charge ΔQb lost by the integration capacitor 39. When this happens, the voltage Vb on the charge-transfer node 33 reaches the triggering voltage of the first decoupling stage 71, and the charge-sharing process is automatically interrupted. In addition, as for the circuit of FIG. 7, the logic signal MSB enables discrimination as to whether the charge of only one or of both of the charge-regeneration capacitors 37, 38 has been used.

In practice, the reading circuit 70 described above advantageously enables automatic control of the charge-sharing process, without any need to resort to external timing signals, thus simplifying the control circuits. Furthermore, as for the circuits of FIGS. 7 and 10, no additional boosting circuits are required.

Finally, it is clear that numerous modifications and variations may be made to the reading method and circuit described and illustrated herein, all falling within the scope of the invention, as defined in the attached claims. In particular, the method described can be used for reading memory cells of a different type, whether volatile or non-volatile ones.

In addition, the charge used for reintegration of the charge lost by the integration capacitor may be further divided by using a larger number of charge-regeneration capacitors or by performing a larger number of charging and sharing cycles. In this way, given the same supply voltages, it is possible to set further apart the output-voltage levels corresponding to the programming states of the cell, and hence to increase the number of bits storable in each cell; on the other hand, given the same distance between the levels, it is possible to operate with even lower supply voltages.

It is obviously possible to carry out a number of charging and sharing cycles also in the presence of two or more charge-regeneration capacitors.

If the charge available for restoring the charge lost by the integration capacitor is divided in more than two packets, it is necessary to provide a counter which undergoes an increment each time one of the two charge-regeneration capacitors discharges. In this way, it is possible to count the number of completely used packets of charge Qa, and so arrive at the charge ΔQb lost by the integration capacitor, and hence at the programming level of the cell (in the examples of embodiment here illustrated, the count is performed by the comparator 53 and the logic signal MSB).

In addition, the decoupling circuits may be made also in a different way: typically, by supplying the cascode transistors with pre-set biasing voltages which modulate the conductivity of these transistors also in proportion to the voltage Vb present on their terminals connected to the memory cell (drain terminals), and hence eliminating the inverting elements. In some embodiments the pass transistors may not be present.

We claim:

1. A method for reading a memory cell, comprising the steps of:
   supplying said cell with a first charge quantity through a capacitive integration element; and
   supplying in sequence said capacitive integration element, through at least one capacitive charge-regeneration element, with a plurality of second charge quantities that restore said first charge quantity.

2. The method according to claim 1, wherein said step of sequentially supplying comprises charge sharing between said capacitive integration element and said at least one capacitive charge-regeneration element.

3. The method according to claim 1 wherein said step of sequentially supplying comprises charging said at least one capacitive charge-regeneration element to a pre-set value of charge and connecting said at least one capacitive charge-regeneration element to said capacitive integration element, sharing said pre-set charge value.

4. The method according to claim 3, further comprising interrupting said connecting step when said first charge quantity is restored.

5. The method according to claim 4, wherein said interruption step comprises detecting a voltage on said capacitive integration element and disconnecting said capacitive integration element from said at least one capacitive charge-regeneration element when said voltage on said capacitive integration element reaches a pre-set triggering voltage.

6. The method according to claim 3, wherein said step of supplying comprises repeating said steps of charging and connecting if said voltage on said capacitive integration element is lower than a pre-set triggering voltage.

7. The method according to claim 6, further comprising the step of counting the number of repetitions of said charging and connecting steps.

8. The method according to claim 1 wherein said step of sequentially supplying comprises the steps of:
   charging a plurality of charge-regeneration capacitors each with a pre-set charge value; and
   alternately and sequentially connecting said charge-regeneration capacitors to said capacitive integration element.

9. The method according to claim 6, further comprising the steps of:
   providing first and second switches respectively between said charge-regeneration capacitors and said capacitive integration element;
   after said step of supplying said first charge quantity, controlling alternate and sequential closing of said first and second switches.

10. The method according to claim 1, wherein said step of supplying said first charge quantity comprises linearly discharging said capacitive integration element in a pre-set time interval.

11. The method according to claim 1, wherein said step of supplying said first charge quantity comprises biasing said memory cell at a constant voltage.

12. A device for reading a memory cell, comprising:
   a capacitive integration element supplying said cell with a first charge quantity; and
   a charge-packets distributing circuit that includes at least one capacitive charge-regeneration element and supplies in sequence said capacitive integration element with a plurality of second charge quantities for restoring said first charge quantity.

13. The device according to claim 12, comprising a plurality of capacitive charge-regeneration elements, connection means for connecting alternately and in sequence said capacitive charge-regeneration elements to said capacitive integration element, and charge-transfer means for transferring said first charge quantity from said capacitive integration element to said cell.

14. The device according to claim 13, wherein said connection means comprise first decoupling means connected between said capacitive integration element and said capacitive charge-regeneration elements.

15. The device according to claim 14, wherein said first decoupling means comprise first decoupling switches and first measurement and control means measuring a voltage on said capacitive integration element and controlling opening of said first decoupling switches when said voltage on said capacitive integration element is higher than a triggering voltage.

16. The device according to claim 15, wherein said first decoupling means comprise a first cascode stage.

17. The device according to claim 16, wherein said connection means further comprise a plurality of charge-sharing switches respectively set between said capacitive integration element and a respective one of the capacitive charge-regeneration elements; said charge-sharing switches being activatable for connecting alternately and in sequence one of said capacitive charge-regeneration elements to said capacitive integration element.

18. The device according to claim 17, wherein said charge-sharing switches comprise second decoupling means connected between a first and a second of said capacitive charge-regeneration elements; said second decoupling means comprising second decoupling switches and second measurement and control means measuring a voltage on said first capacitive charge-regeneration element and controlling opening of said second decoupling switches when said voltage on said first capacitive charge-regeneration element is higher than said triggering voltage.

19. The device according to claim 18, wherein said second decoupling means comprise a second cascode stage.

20. The device according to claim 13, further comprising a supply line, which supplies a supply voltage, and charge-switching means for alternately connecting and disconnecting said capacitive integration element and said capacitive charge-regeneration elements to/from said supply line.

21. The device according to claim 13, wherein said charge-transfer means comprise activation means for activating said memory cell for a pre-set time.

22. A device for reading a memory cell, comprising:
    a first capacitive element structured to supply the memory cell with a current while the first capacitive element is being discharged;
    a second capacitive element structured to recharge the first capacitive element after the first capacitive element is discharged;
    a charge switch coupled between a power source and the second capacitive element and structured to recharge the second capacitive element; and
    a control switch connected between the first and second capacitive elements and structured to selectively disconnect the first and second capacitive elements when the fist capacitive element is supplying the memory cell with the current, the control switch being structured to selectively connect the first and second capacitive elements to enable the second capacitive element to recharge the firs capacitive element.

23. The device of claim 22, further comprising an inverting element having an input coupled to a first conduction terminal of the control switch and an output coupled to a control terminal of the control switch, the control switch including a second conduction terminal coupled to the second capacitive element.

24. The device of claim 22, further comprising a third capacitive element coupled by the control switch to the first capacitive element, wherein the second capacitive element is structured to recharge the first capacitive element during a first recharge period and the third capacitive element is structured to recharge the first capacitive element during a second recharge period.

25. The device of claim 24, further comprising a decoupling transistor connected between the second and third capacitive elements.

26. The device of claim 22, further comprising a comparator having a first input coupled to the second capacitive element, a second input coupled to a reference voltage, and an output coupled to a control terminal of the charge switch, the comparator being structure to cause the charge switch to recharge the second capacitive element in response to detecting that a voltage on the second capacitive element is below the reference voltage.

* * * * *